(12) United States Patent
Cheng et al.

(10) Patent No.: US 10,541,148 B2
(45) Date of Patent: Jan. 21, 2020

(54) METHOD FOR CONTROLLING THE AMOUNT OF RADIATION HAVING A PREDETERMINED WAVELENGTH TO BE ABSORBED BY A STRUCTURE DISPOSED ON A SEMICONDUCTOR

(71) Applicant: Raytheon Company, Waltham, MA (US)

(72) Inventors: Kezia Cheng, Lowell, MA (US); Kamal Tabatabaie Alavi, Sharon, MA (US); Adrian D. Williams, Methuen, MA (US); Christopher J. MacDonald, Medford, MA (US); Kiuchul Hwang, Amherst, NH (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/220,248

(22) Filed: Dec. 14, 2018

(65) Prior Publication Data

US 2019/0198346 A1    Jun. 27, 2019

Related U.S. Application Data

(60) Provisional application No. 62/609,826, filed on Dec. 22, 2017.

(51) Int. Cl.
*H01L 23/48* (2006.01)
*H01L 23/52* (2006.01)
(Continued)

(52) U.S. Cl.
CPC ...... *H01L 21/321* (2013.01); *H01L 21/28575* (2013.01); *H01L 21/32051* (2013.01); *H01L 29/452* (2013.01)

(58) Field of Classification Search
CPC ............ H01L 21/043; H01L 21/32051; H01L 21/28576; H01L 21/485
(Continued)

(56) References Cited

U.S. PATENT DOCUMENTS 3,371,213 A * 2/1968 Adams ............... G01J 1/04
257/200
5,189,297 A * 2/1993 Ahlgren ............. H01L 21/76
250/214.1
(Continued)

FOREIGN PATENT DOCUMENTS

TW    201140738 A1    11/2011

OTHER PUBLICATIONS

Machac; "Laser annealed W/Sn contacts on N-type GaAs"; Electronics Letters; vol. 30; No. 14; pp. 1185-1187; Jul. 7, 1994; 3 Pages.
(Continued)

*Primary Examiner* — S. V. Clark
(74) *Attorney, Agent, or Firm* — Daly, Crowley, Mofford & Durkee, LLP (57) ABSTRACT

A stack of layers providing an ohmic contact with the semiconductor, a lower metal layer of the stack is disposed in direct contact with the semiconductor; and a radiation absorption control layer disposed over the lower layer for controlling an amount of the radiant energy to be absorbed in the radiation absorption control layer during exposure of the stack to the radiation during a process used to alloy the stack with the semiconductor to form the ohmic contact.

12 Claims, 8 Drawing Sheets

(51) Int. Cl.
*H01L 29/40* (2006.01)
*H01L 21/321* (2006.01)
*H01L 29/45* (2006.01)
*H01L 21/3205* (2006.01)
*H01L 21/285* (2006.01)

(58) Field of Classification Search
USPC ........ 257/750, 763, 764; 438/648, 650, 652, 438/656
See application file for complete search history.

(56) References Cited

U.S. PATENT DOCUMENTS

| | | | |
|---|---|---|---|
| 5,336,641 A | 8/1994 | Fair et al. | |
| 9,917,171 B2 * | 3/2018 | Hahn | H01L 29/452 |
| 2015/0187991 A1 * | 7/2015 | McGroddy | H01L 27/016 257/13 |
| 2016/0300973 A1 * | 10/2016 | Shen | H01L 31/022408 |

OTHER PUBLICATIONS

Notification of Transmittal of the International Search Report and Written Opinion of the ISA dated Mar. 27, 2019 for International Application No. PCT/US2018/065634; 1 Page.
Search Report dated Mar. 27, 2019 for International Application No. PCT/US2018/065634; 4 Pages.
Written Opinion of the ISA dated Mar. 27, 2019 for International Application No. PCT/US2018/065634; 12 Pages.

* cited by examiner

METHOD FOR CONTROLLING THE AMOUNT OF RADIATION HAVING A PREDETERMINED WAVELENGTH TO BE ABSORBED BY A STRUCTURE DISPOSED ON A SEMICONDUCTOR

CROSS REFERENCE TO RELATED APPLICATION

This application claims priority from U.S. Provisional Patent Application Ser. No. 62/609,826, filed on Dec. 22, 2017 which is incorporated herein by reference in its entirety.

TECHNICAL FIELD

This disclosure relates generally to methods for forming structures on a semiconductor and more particularly to methods for heating such structures.

BACKGROUND

As is known in the art, many semiconductor devices require heating of various structures on the semiconductor. For example field effect transistors (FETs) use ohmic contacts for source contacts and drain contacts. One type of FET is a Gallium Nitride High Electron Mobility Transistor (HEMT) having source and drain electrodes in ohmic contact with an Aluminum Gallium Nitride (AlGaN) semiconductor layer. GaN and AlGaN are wideband gap semiconductor. It is difficult to make a reliable ohmic contact with good metal morphology on these wide band gap semiconductors. Many approaches have been tried with a variety of metal mixtures on GaN and AlGaN such as Ti/Al/Ni/Au, Ti/Al/Ti/Au, Ti/Al/Mo/Au, Ti/Al/Ta/Au and Ta/Al/Ta. Variations of the structures had been tried by changing the thickness of each layer in the stack. These metal schemes require high alloy temperature, for example, an alloy temperature in a range of 600° C. to over 900° C. to form the ohmic contact.

Figure 1:
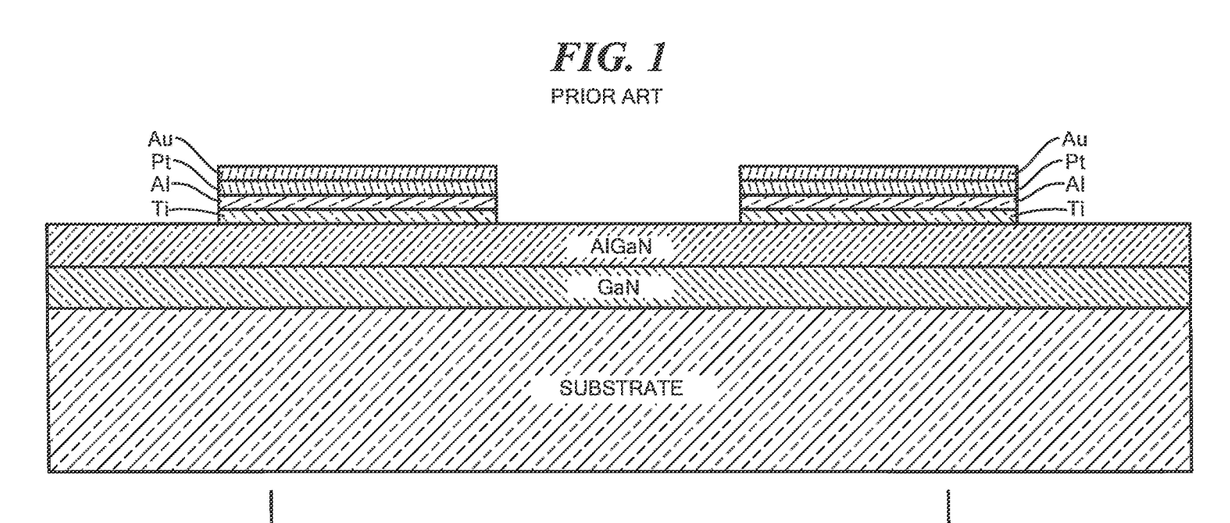
FIG. 1 is a diagrammatical sketch of a cross section of a semiconductor structure according to the PRIOR ART.
Figure 2:
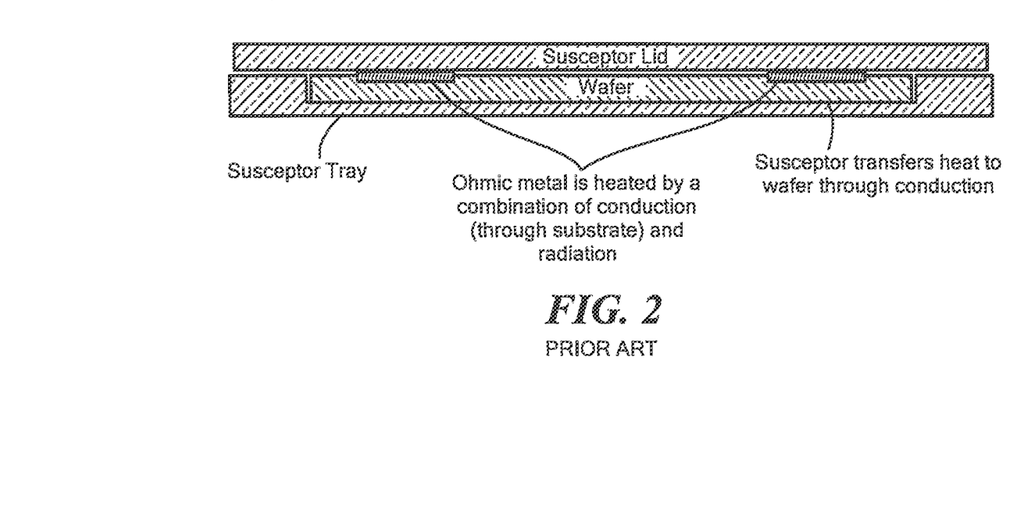
FIG. 2 is a diagrammatical sketch of an arrangement used to for the semiconductor structure according to the PRIOR ART.

One technique used to provide the required high alloy temperature is called a Rapid Thermal Anneal (RTA) process. In an RTA alloy process, the wafer having many FET structures to be processed is placed inside the RTA, as shown in FIG. 2. The heating lamps, such as, Tungsten Halogen heating lamps radiating energy primarily in the visible radiation band and extending in the Infrared bands and slightly in the ultraviolet bands, are used to heat the ohmic metal by radiation.

SUMMARY

In accordance with the present invention a method is provided for controlling the amount of radiation having a predetermined wavelength to be absorbed by a structure disposed on a semiconductor, comprising: (A) providing an layer of material over the structure, such material having a reflectance selected in accordance with the amount of radiation to be absorbed by the structure; and (B) subjecting the structure with the layer of material thereon to radiation having the predetermined wavelength.

In one embodiment, an ohmic contact is provided for a semiconductor. The ohmic contact comprises: a stack of layers comprising: a lower metal layer disposed in direct contact with the semiconductor; and a radiation absorption control layer disposed over the lower layer for controlling an amount of the radiant energy to be absorbed in the radiation absorption control layer during exposure of the stack to the radiation during a process used to alloy the stack with the semiconductor to form the ohmic contact.

In one embodiment, an ohmic contact is provided for a semiconductor. The ohmic contact comprises: a stack of layers, comprising: a lower metal layer disposed in direct contact with the semiconductor, an intermediate layer disposed over the lower metal layer, the intermediate layer having a predetermined energy absorbing coefficient to radiant energy having a predetermined wavelength; and a radiation absorbing layer disposed over the intermediate layer, the upper layer having a predetermined energy absorbing coefficient to the radiant energy at least an order of magnitude greater than the predetermined energy absorbing coefficient of the intermediate layer to the radiant energy.

In one embodiment, the intermediate layer has a predetermined electrical resistivity and wherein the upper layer has a predetermined electrical resistivity at least an order of magnitude lower than the predetermined electrical resistivity of the intermediate layer.

In one embodiment the radiant energy is infrared radiant energy.

In one embodiment, the radiant energy comprises a predetermined band of wavelengths.

In one embodiment, a method is provided for forming an ohmic contact with a semiconductor layer using radiation having a predetermined wavelength, comprising: (A) providing an ohmic contact stack comprising: a top layer comprising a metal layer having an predetermined energy absorbing coefficient to radiant energy having a predetermined wavelength, the predetermined energy absorbing coefficient of the top layer being selected in accordance with an amount of the radiant energy to be absorbed by the ohmic contact stack to form the ohmic contact; and, an electrically conductive layer under the top layer and in contact with the semiconductor layer; and (B) annealing the ohmic contact stack with the semiconductor layer to form the ohmic contact comprising exposing the top layer of the stack to the radiant energy having the predetermined wavelength.

In one embodiment, a method is provided for forming an ohmic contact to a semiconductor layer. The method comprises: (A) providing an ohmic contact stack comprising: a top layer having an predetermined energy absorbing coefficient to radiant energy having a predetermined wavelength and having a predetermined electrical resistivity; and; an electrically conductive layer under the top layer, the electrically conductive layer having a predetermined energy absorbing coefficient to the radiant energy at least an order of magnitude less than the predetermined energy absorbing coefficient of the top layer and having a predetermined electrical resistivity at least an order of magnitude greater than the predetermined electrical resistivity of the top layer; and (B) annealing the ohmic contact stack with the semiconductor layer to form the ohmic contact comprising exposing the top layer of the stack to the radiant energy having the predetermined wavelength with a portion of the radiant energy being absorbed by the top layer.

In particular, the ohmic morphology is dependent on metal coverage. Large area of ohmic metal is smoother than small isolated ohmic structures after alloy, which have rough morphology. This disclosure solves the ohmic pattern coverage dependency issue by employing a radiation absorption control layer on the ohmic metal. The industry has been investigating alternative solutions including GaN ohmic regrowth, Ta based ohmic and other low alloy temperature structures. So far, each of these techniques has its own challenges and consequently they have not been implemented for production. Gold, while an excellent electrical conductor having a low electrical resistivity, on the ohmic metal however reflects radiation across the visible spectrum and into the long wavelength region. Therefore large ohmic area will reflect more heat and become locally cooler. Thus, gold is used as the upper layer for its high electrical conductivity and inertness and therefore its desirability in connecting the ohmic contact to other electronic circuitry. The inventors having recognized that particularly for large ohmic contacts, because of high reflectance of Au, these large ohmic contact areas will reflect high levels of the radiant energy and be undesirably cooler.

The upper radiation absorbing layer should have the following properties: 1. Low reflectance in the long wavelength region of the radiation spectra; 2. The addition of this layer will not interfere with the alloy process; 3. Will not degrade the ohmic contact; 4. Is stable; 5. Can be easily evaporated; 6. Is electrically conductive since this layer will become an integral part of the ohmic metal. One such material for the upper radiation absorbing layer is Titanium having about a 50%-60% reflectance to the radiant energy in the in the long wavelength region (800 nm to over 1300 nm).

This invention solved both the pattern density dependency and rough morphology issues at the same time. Most in the industry have generally focused their effort on finding a different ohmic metal (such as Ta based, NiO based and ohmic regrowth), this disclosure addressed the root cause of ohmic density dependency. The upper radiation absorbing layer is, in effect, a "radiation absorption control" layer, which assists in controlling the alloy temperature so that the amount of heating by radiation can be adjusted. Although a thin titanium (Ti) layer is used in the embodiment described below, other materials or combination of materials may be used. The thin layer of Ti disposed over the ohmic metal is used to reduce the reflectance of Au to eliminate pattern density dependency.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 3:
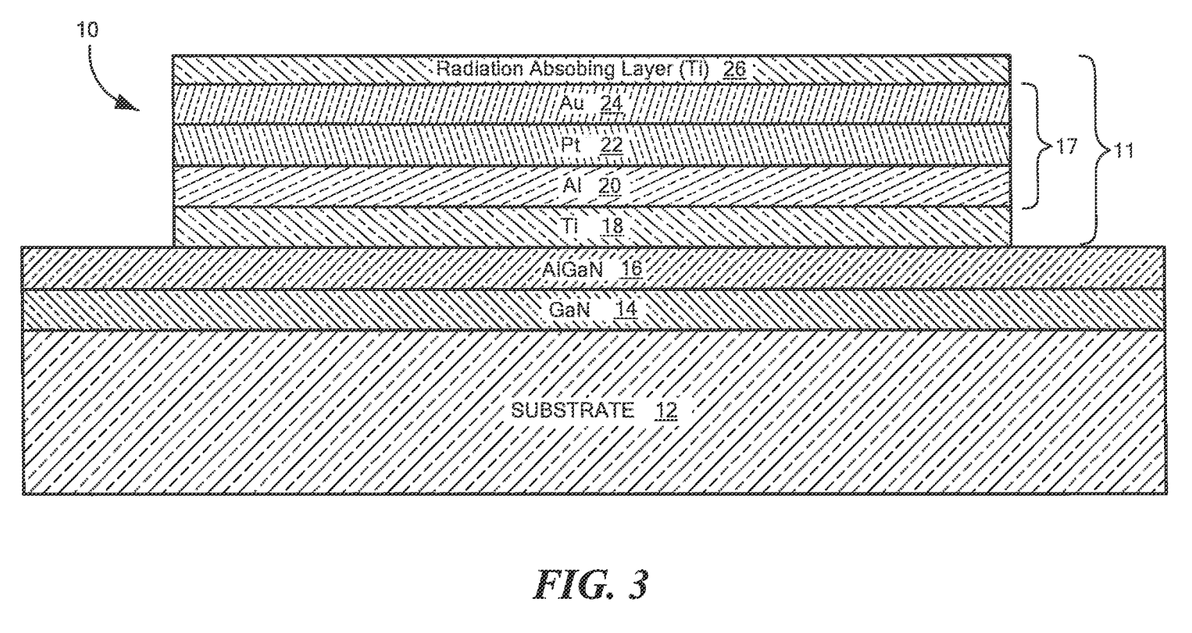
FIG. 3 is a diagrammatical sketch of a cross section of a semiconductor structure according to the disclosure.

Referring now to FIG. 3, a semiconductor structure 10 having a pre-annealed ohmic contact stack 11 for the structure 10, is shown. More particularly, a substrate, 12 here for example, silicon carbide (SiC) 12 has a Gallium Nitride (GaN) semiconductor layer 14 over the substrate 12, an Aluminum Gallium Nitride (AlGaN) semiconductor layer 16 on the GaN layer 14 and an ohmic contact stack 17 on the AlGaN layer 16. The ohmic contact stack 17 includes: a bottom layer, here Titanium (Ti) layer 18 in direct contact with the AlGaN layer 16, an Aluminum (Al) layer 20 on the Ti layer 18; a Platinum (Pt) layer 22 on the Al layer 20; and a Gold (Au) layer 24 on the Pt layer 22, as shown. The ohmic contact stack 17 is provided with a radiation absorbing control layer 26, here for example Titanium (Ti) layer on the stack 17, more particularly on the Au layer 24, as shown. It is noted that the radiation absorbing control layer 26 has a predetermined energy absorbing coefficient to infrared radiant energy used to heat the structure 10 at least an order of magnitude greater than the predetermined energy absorbing coefficient of the Au layer 24 to the infrared radiant energy. It is also noted that the radiation absorbing control layer 26 has a predetermined electrical resistivity at least an order of magnitude higher than the predetermined electrical resistivity of the Au layer 24.

Figure 4:
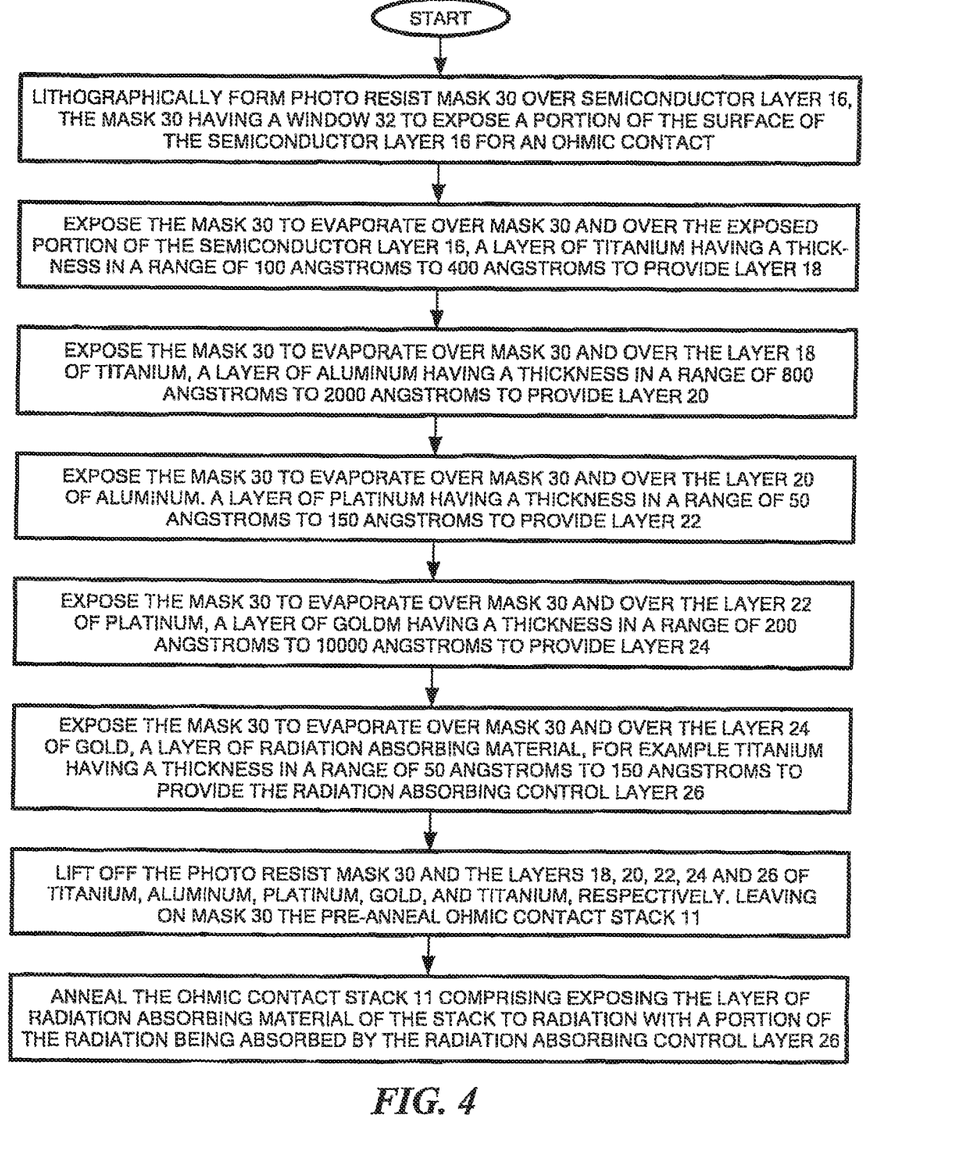
FIG. 4 is a flow chart of a process used to form the semiconductor structure of FIG. 3.
Figure 4A:
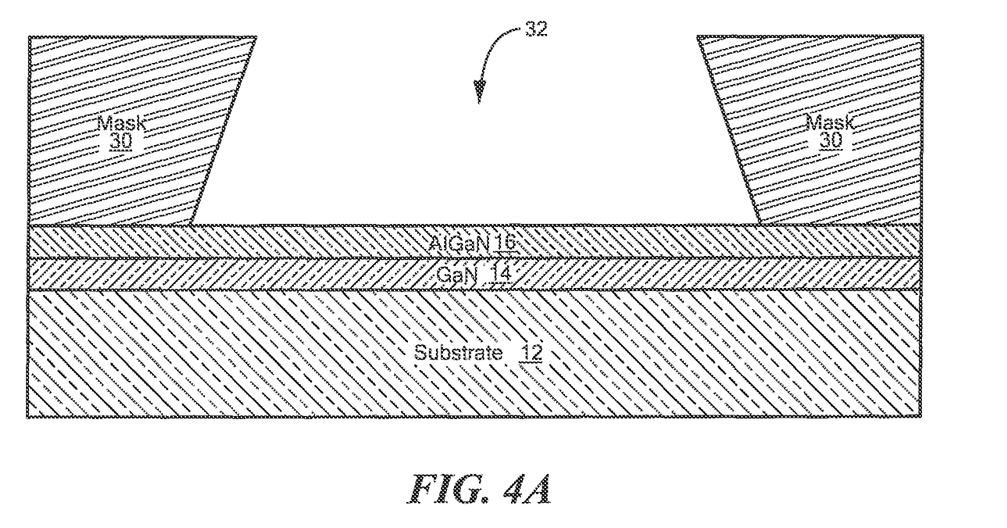
FIGS. 4A-4F is a series of a diagrammatical sketch of a cross section of a semiconductor structure at various steps used in the process to form the semiconductor structure of FIG. 3 according to the disclosure.
Figure 4B:
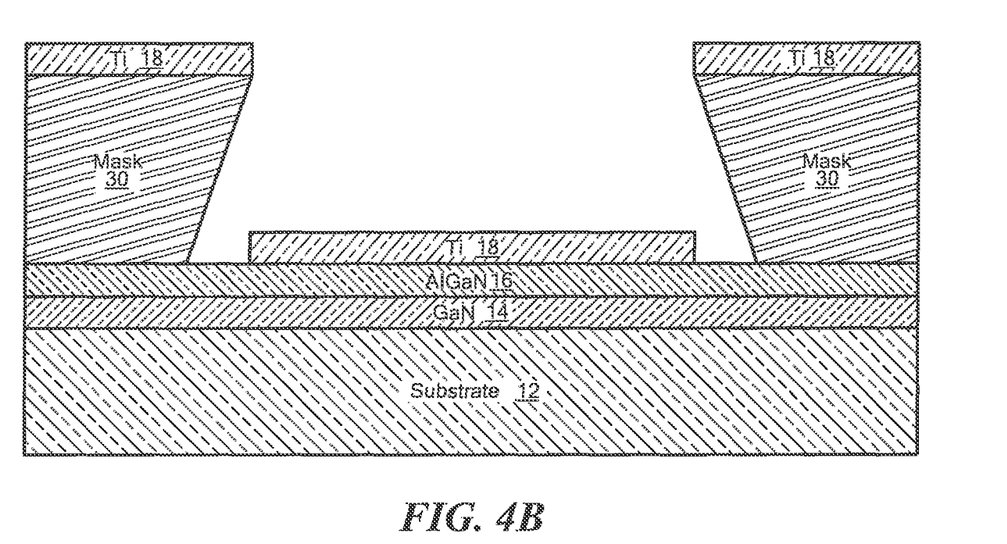
Figure 4C:
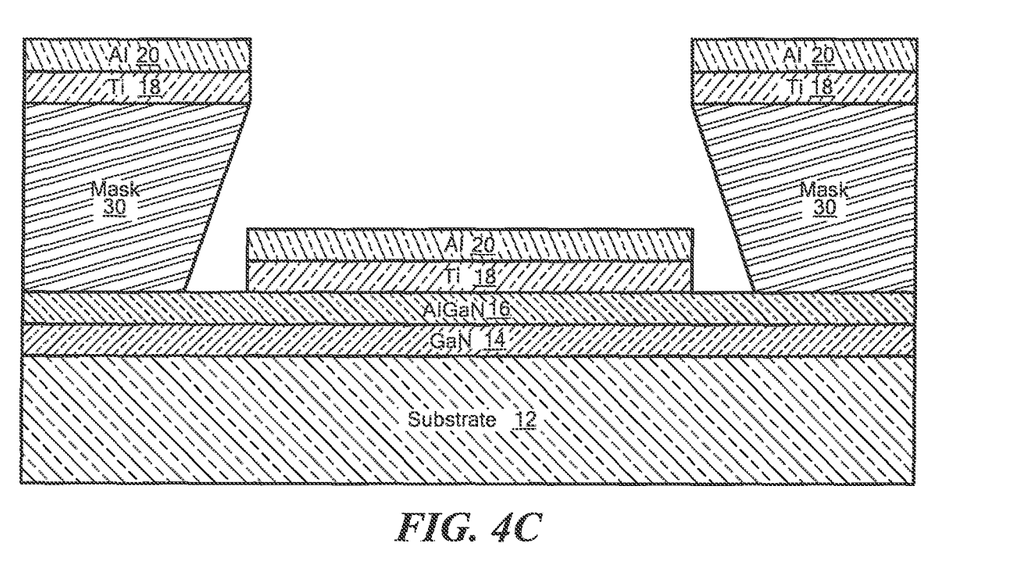
Figure 4D:
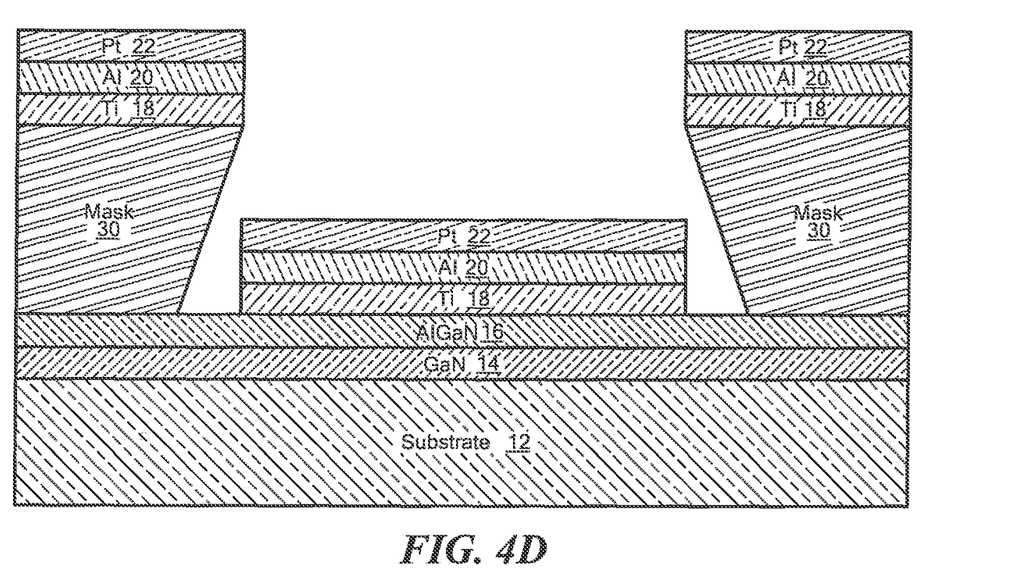
Figure 4E:
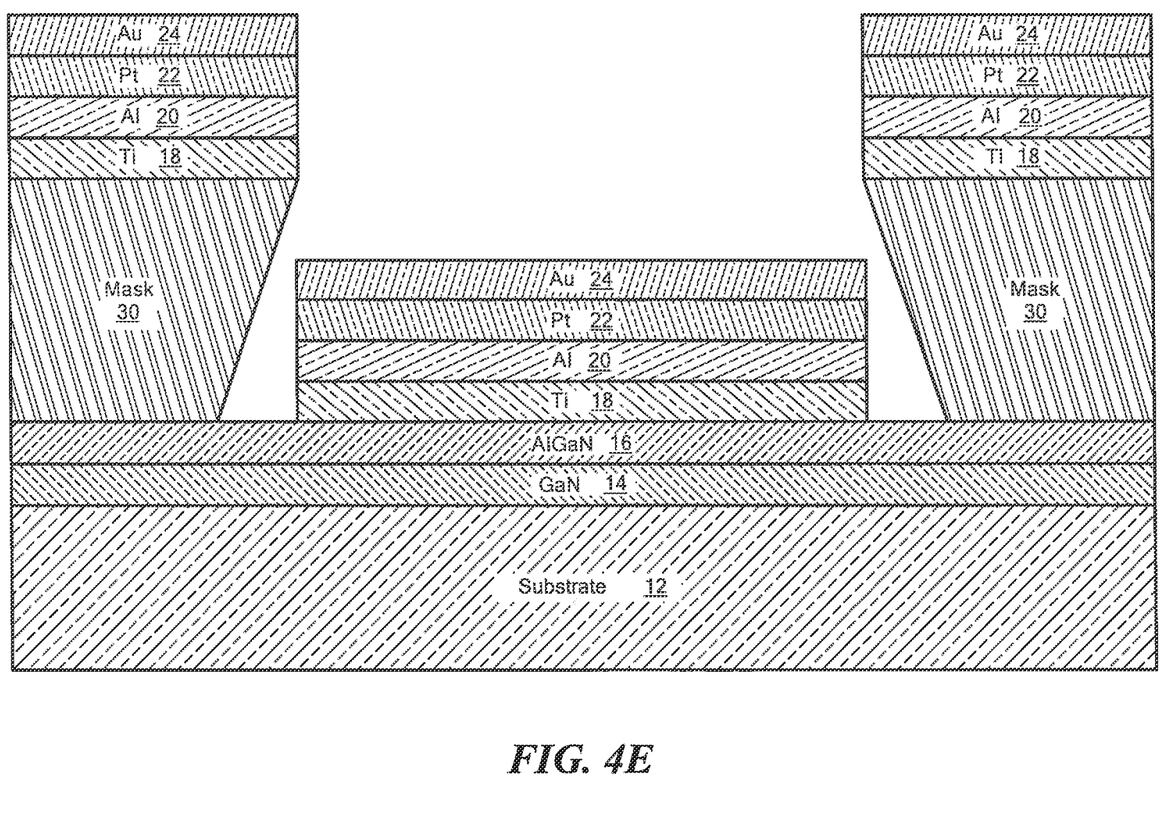
Figure 4F:
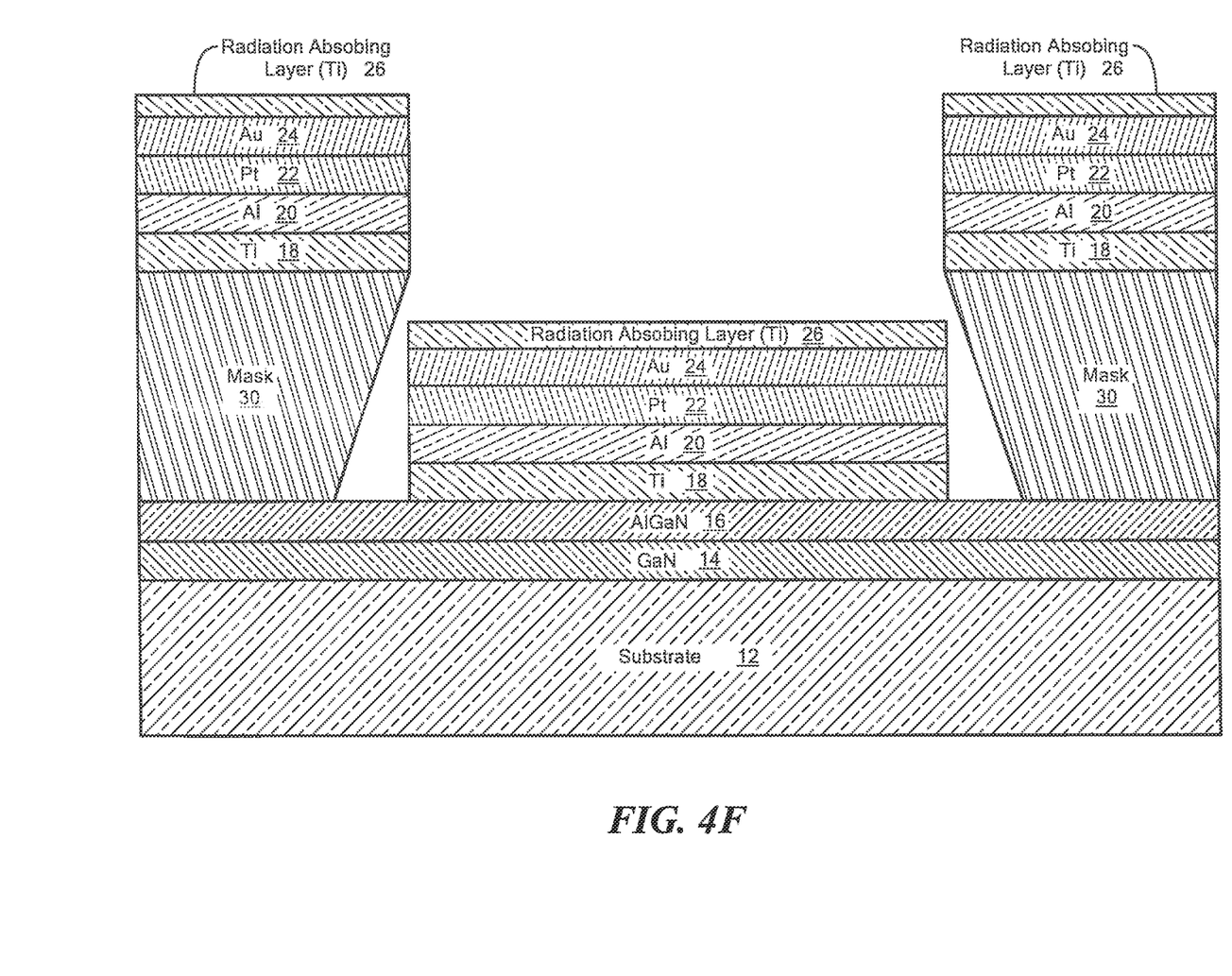

Referring now to FIG. 4, a flow chart of a process for forming the ohmic contact to the semiconductor layer 16, is shown. After providing the insulating substrate 12 with the semiconductor layer 14 and semiconductor layer 16 on layer 14, the process begins and includes: lithographically forming a photoresist mask 30 (FIG. 4A) over semiconductor layer 16 having a window 32 therein to exposing a portion of the surface of the semiconductor layer 16, as shown, for the ohmic contact; exposing the substrate 12 with mask 30 to an electron beam evaporator (E-beam evaporator), not shown, wherein an electron beam is used to strike the metal source in the E-beam evaporator to melt a portion of the metal in the E-beam evaporator, and then evaporate the melted metal and thereby produce a stream of flux of metal vapor which becomes deposited on a target in the evaporator. The stream of evaporated metal is herein sometimes referred to herein as "evaporant" or "evaporant flux". Here the target is the insulating substrate 12 with the semiconductor layer 14 and semiconductor layer 16 on layer 14, the formed photoresist mask 30 having the window 32 therein to exposing a portion of the surface of the semiconductor layer 16. The first metal source is titanium, thus, the titanium metal in the source is evaporated and deposited as a layer of titanium metal over mask 30 and over exposed portion of the semiconductor layer 16 to form a layer 18 of titanium, here for example, having a thickness in a range of 100 angstroms to 400 angstroms (FIG. 4B); next, the metal source is changed from titanium to aluminum thereby exposing the mask 30 to an evaporated aluminum flux to deposit aluminum metal over mask 30 and over the layer 18 of titanium, a layer of aluminum having a thickness in a range of 800 angstroms to 2000 angstroms to provide the layer 20 (FIG. 4C); next, the metal source is changed from aluminum to platinum thereby exposing the mask 30 to an evaporated platinum flux to deposit platinum metal over mask 30 and over layer 20 of aluminum, the layer of platinum here having, for example, a thickness in a range of 50 angstroms to 150 angstroms to provide layer 22 (FIG. 4D); next, the source is changed from platinum to gold thereby exposing the mask 30 to an evaporant flux of gold to deposit gold metal over mask 30 and over layer 22 of platinum, the layer of gold, here, for example, having a thickness in a range of 200 angstroms to 100000 angstroms to provide gold layer 24 (FIG. 4E); next, the source is changed from gold to a metal that will serve as a radiation absorbing material thereby exposing the mask 30 to an evaporant flux of the metal that will serve as a radiation absorbing material 1 over mask 30 and over layer 24 of gold; here, for example, a layer of titanium having a thickness in a range of 50 angstroms to 150 angstroms to provide the radiation absorbing control layer 26 (FIG. 4F); and lifting off the photoresist mask 30 and the titanium layer 18, aluminum layer 20, platinum layer 22, gold 24 and titanium layer 26 simultaneously with the mask 30 leaving the pre-anneal ohmic contact stack 11 (FIG. 3).

Figure 5:
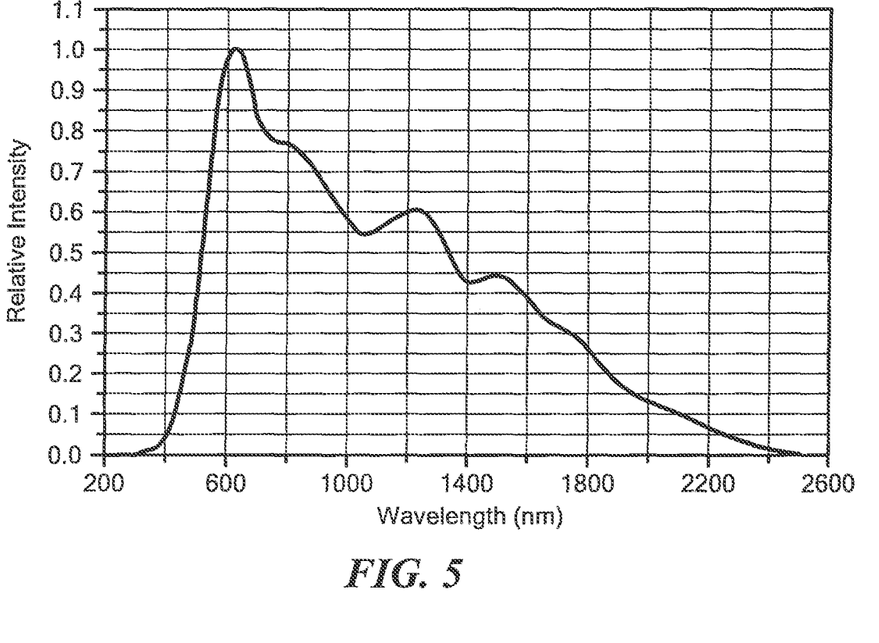
FIG. 5 is the radiation emitting spectrum of Rapid Thermal Anneal equipment used in the process of forming the semiconductor structure of FIG. 3 normalized to the peak radiation level at a particular wavelength having the maximum radiation according to the disclosure the shown in FIG. 5.

Next, the process includes alloying the pre ohmic contact stack 11 comprising exposing the radiation absorbing control layer 26 of the pre-alloy stack 11 to radiation with a portion of the radiation being absorbed by the radiation absorbing control layer 26. More particular, the structure 10 (FIG. 3) with the pre-annealed ohmic stack 11 is placed in a susceptor, for example, a graphite susceptor. The susceptor is then placed in a RTA chamber, such as for example, a Heatpuise RTA manufactured by AG Associates sold by OEM Group, Inc.® 2120 W. Guadalupe Road Gilbert, Ariz. 85233 which includes a source of radiation; here for example a source having a radiation emitting spectrum normalized to the peak radiation level at a particular wavelength having the maximum radiation of about 600 nm shown in FIG. 5, here for example a tungsten halogen lamp.

Figure 6:
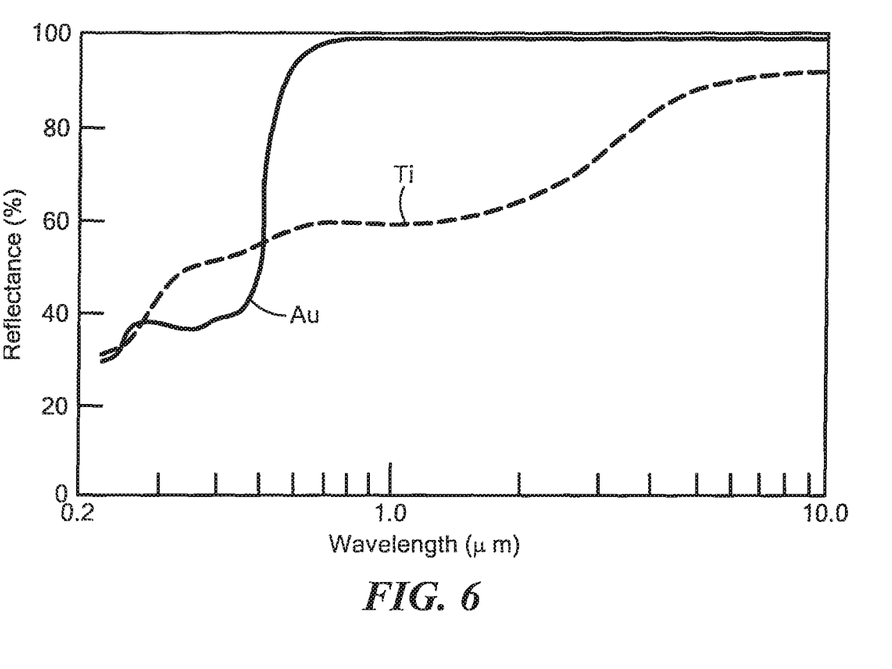
FIG. 6 is a graph showing the relationship between reflectance and wavelength for various metals including titanium used in the semiconductor structure of FIG. 3.

It is noted that from energy radiated with wavelengths from about 600 to 1000 nm, gold has a reflectance of about 99% (1 percent absorptive) (FIG. 6) and Ti has a range of reflectance of between 55% and 60% (45% to 40% absorptive). Thus, Ti is about 40 to 45 times more absorptive than gold. It is also noted that the electrical resistivity of gold is 2.2 micro Ohm-cm and the electrical resistivity of Ti is 42 micro Ohm-cm. Thus, the layer 26 of the Ti radiation absorbing control layer 26, is exposed to the infrared radiant energy having a band of wavelengths from about 600 to 1200 nm has a predetermined energy absorbing coefficient at least an order of magnitude greater than the predetermined energy absorbing coefficient of the gold layer to the infrared radiant energy in the region 600 to 1200 nm.

A number of embodiments of the disclosure have been described. Nevertheless, it will be understood that various modifications may be made without departing from the spirit and scope of the disclosure. For example, the radiation absorption control layer 26 may be a dielectric material during the alloy process but is removed subsequently in order to make electrical contact to the ohmic contact. Still further, the method may be used in the formation of other structures than ohmic contact structures. Still further, the method may be used with other stacks. Still further the method may be used with radiation absorption control layers that reduce the amount of radiation absorbed by the stack or structure for example by forming a layer over the stack or structure having a higher reflectance than that of the underlying stack or structure. In another application the radiation absorption control layers may be used to protect underlying structures by using a radiation absorption control layer having a higher reflectance than the layer under the radiation absorption control layer. Accordingly, other embodiments are within the scope of the following claims.

What is claimed is:

1. An ohmic contact comprising: a stack of metal layers providing an ohmic contact with the semiconductor, comprising: a lower layer disposed in direct contact with the semiconductor; and a radiation absorption control layer disposed over the lower layer for controlling an amount of the radiant energy to be absorbed in the radiation absorption control layer during exposure of the stack to the radiation during a process used to anneal the stack with the semiconductor to form the ohmic contact.

2. An ohmic contact for a semiconductor, comprising:
   a stack of layers providing an ohmic contact with the semiconductor, comprising:
      a lower metal layer disposed in direct contact with the semiconductor;
      an intermediate layer disposed over the lower layer, the intermediate layer having a predetermined energy absorbing coefficient to radiant energy having a predetermined wavelength; and
      a radiation absorbing layer disposed over the intermediate layer, the radiation absorbing layer having a predetermined energy absorbing coefficient to the radiant energy at least an order of magnitude greater than the predetermined energy absorbing coefficient of the intermediate layer to the radiant energy.

3. The ohmic contact recited in claim 2 wherein the radiant energy is infrared radiant energy.

4. The ohmic contact recited in claim 2 wherein the radiant energy comprises a predetermined band of wavelengths.

5. The ohmic contact recited in claim 2 wherein the intermediate layer has a predetermined electrical resistivity and wherein the upper layer has a predetermined electrical resistivity at least an order of magnitude lower than the predetermined electrical resistivity of the intermediate layer.

6. A method for forming an ohmic contact with a semiconductor layer using radiation having a predetermined wavelength, comprising: (A) providing an ohmic contact stack comprising: a top layer comprising a layer having an predetermined energy absorbing coefficient to radiant energy having the predetermined wavelength, the predetermined energy absorbing coefficient of the top layer being selected in accordance with an amount of the radiant energy to be absorbed by the ohmic contact stack to form the ohmic contact; and, an electrically conductive layer under the top layer and in contact with the semiconductor layer; and (B) annealing the ohmic contact stack with the semiconductor layer to form the ohmic contact comprising exposing the top layer of the stack to the radiant energy having the predetermined wavelength.

7. The method recited in claim 6 wherein the radiant energy comprises a predetermined band of wavelengths.

8. A method for forming an ohmic contact to a semiconductor layer, comprising:
   (A) providing an ohmic contact stack comprising:
      a top layer comprising a metal layer having an predetermined energy absorbing coefficient to radiant energy having a predetermined wavelength and having a predetermined electrical resistivity; and;
      an electrically conductive layer under the top layer, the electrically conductive layer having a predetermined energy absorbing coefficient to the radiant energy at least an order of magnitude less than the predetermined energy absorbing coefficient of the top layer and having a predetermined electrical resistivity at least an order of magnitude greater than the predetermined electrical resistivity of the top layer, and (B) alloying the ohmic contact stack with the semiconductor layer to form the ohmic contact comprising exposing the top layer of the stack to the radiant energy having the predetermined wavelengths with a portion of the radiant energy being absorbed by the top layer.

9. The method recited in claim 8 wherein the radiant energy comprises a predetermined band of wavelengths.

10. A method for forming an ohmic contact to a semiconductor layer, comprising:
lithographically forming photoresist mask over semiconductor layer having window to exposing a portion of the surface of the semiconductor layer for the ohmic contact;
exposing the mask to deposit metal over mask and over exposed portion of the semiconductor to a layer of titanium having a thickness in a range of 100 angstroms to 400 angstroms;
exposing the mask to deposit metal over mask and over a layer of aluminum having a thickness in a range of 800 angstroms to 2000 angstroms;
exposing the mask to deposit metal over mask and over a layer of aluminum a layer of platinum having a thickness in a range of 50 angstroms to 150 angstroms;
exposing the mask to an evaporant flux to deposit metal over mask and over layer of platinum a layer of gold having a thickness in a range of 200 angstroms to 100000 angstroms;
exposing the mask to deposit metal over mask and over layer of gold a layer of radiation absorbing material, for example titanium having a thickness in a range of 50 angstroms to 150 angstroms;
lifting off the photoresist mask and the layers of titanium, aluminum, platinum, gold, and titanium leaving a pre-alloy ohmic contact stack;
alloying the ohmic contact stack comprising exposing the radiation absorbing material of the stack to radiation with a portion of the radiation being absorbed by the radiation absorbing layer.

11. A method for forming controlling the amount of radiation having a predetermined wavelength to be absorbed by a structure disposed on a semiconductor, comprising: (A) providing an layer of material over the structure, such material having a reflectance selected in accordance with the amount of radiation to be absorbed by the structure; and (B) subjecting the structure with the layer of material thereon to radiation having the predetermined wavelength.

12. A method for forming controlling the amount of radiation having a predetermined band of wavelengths to be absorbed by a structure disposed on a semiconductor, comprising: (A) providing an layer of material over the structure, such material having a reflectance selected in accordance with the amount of radiation to be absorbed by the structure; and (B) subjecting the structure with the layer of material thereon to radiation having the predetermined band of wavelength.

* * * * *